United States Patent
Lee (10) Patent No.: US 9,390,775 B2
(45) Date of Patent: Jul. 12, 2016

(54) REFERENCE VOLTAGE SETTING CIRCUIT AND METHOD FOR DATA CHANNEL IN MEMORY SYSTEM

(71) Applicant: SK hynix Inc., Icheon-si Gyeonggi-do (KR)

(72) Inventor: Hyun Bae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 204 days.

(21) Appl. No.: 14/139,411

(22) Filed: Dec. 23, 2013

(65) Prior Publication Data

US 2015/0121018 A1    Apr. 30, 2015

(30) Foreign Application Priority Data

Oct. 24, 2013   (KR) .................. 10-2013-0127192

(51) Int. Cl.
*G11C 7/10*    (2006.01)
*G11C 5/14*    (2006.01)

(52) U.S. Cl.
CPC .............. *G11C 7/1081* (2013.01); *G11C 5/147* (2013.01); *G11C 2207/2254* (2013.01)

(58) Field of Classification Search
CPC ................... G11C 7/1081; G11C 2207/2254; G11C 5/147
See application file for complete search history.

(56) References Cited

U.S. PATENT DOCUMENTS

| | | | |
|---|---|---|---|
| 7,230,449 B2* | 6/2007 | Dreps | G06F 13/4072 326/29 |
| 2006/0142977 A1* | 6/2006 | Oh | G11C 5/147 702/190 |
| 2010/0188908 A1* | 7/2010 | Fox | G11C 11/4074 365/189.011 |
| 2011/0286288 A1 | 11/2011 | Mutnury et al. | |
| 2012/0081100 A1* | 4/2012 | Lee | G11C 29/021 323/314 |

* cited by examiner

*Primary Examiner* — J. H. Hur
*Assistant Examiner* — Ajay Ojha
(74) *Attorney, Agent, or Firm* — William Park & Associates Ltd.

(57) ABSTRACT

A semiconductor memory system includes a memory controller and memory apparatus. The memory controller provides a first data having a first level and a second data having a second level. The memory apparatus adjusts a level of a reference voltage by comparing the reference voltage with each of the first data and the second data.

17 Claims, 6 Drawing Sheets

Number of Increases of Code Value > Number of Decreases of Code Value
=> Initial Reference Voltage Code + (Number of Increases of Code Value − Number of Decreases of Code Value)/2

Number of Increases of Code Value = Number of Decreases of Code Value
=> Keep Initial Reference Voltage Code

FIG.5B

Number of Increases of Code Value > Number of Decreases of Code Value
=> Initial Reference Voltage Code + (Number of Increases of
Code Value − Number of Decreases of Code Value)/2

FIG.5C

Number of Decreases of Code Value > Number of Increases of Code Value
=> Initial Reference Voltage Code − (Number of Decreases of
Code Value − Number of Increases of Code Value)/2

FIG.6

REFERENCE VOLTAGE SETTING CIRCUIT AND METHOD FOR DATA CHANNEL IN MEMORY SYSTEM

CROSS-REFERENCES TO RELATED APPLICATION

The present application claims priority under 35 U.S.C. §119(a) to Korean application number 10-2013-0127192, filed on Oct. 24, 2013, in the Korean Intellectual Property Office, which is incorporated herein by reference in its entirety as set forth in full.

BACKGROUND

1. Technical Field

Various embodiments generally relate to a semiconductor memory system, and more particularly, to a semiconductor memory system including a memory apparatus and a controller.

2. Related Art

In general, a memory apparatus performs write and read operations under the control of a host apparatus. The memory apparatus stores data sent from the host apparatus in the write operation and outputs stored data to the host apparatus in the read operation. The host apparatus includes a processor such as a central processing unit (CPU), a graphic processing unit (GPU) and so forth and provides to the memory apparatus signals and data for controlling the memory apparatus.

A memory controller is adopted for communication between the memory apparatus and the host apparatus. The memory controller and the memory apparatus are included in a semiconductor memory system. The memory controller converts a signal from the host apparatus into a signal that the memory apparatus may understand and process and transmit the converted signal to the memory apparatus. The memory controller converts a signal from the memory apparatus into a signal that the host apparatus may understand and process and transmit the converted signal to the host apparatus. The memory controller is essential for a semiconductor memory system operating with high speed or including a plurality of memory apparatuses.

The semiconductor memory system has a plurality of channels for data transfer. The memory apparatus receives data sent from the memory controller through a data receiver coupled to the plurality of channels. The data receiver receives data valued at '0' or '1' by comparing voltage level of data sent from the memory controller with level of a reference voltage, which it is important to set with accuracy for improvement of the semiconductor memory system. In a semiconductor memory system of the related art, a memory controller adjusts the reference voltage by receiving data, which the memory apparatus received, fed back from the memory apparatus.

SUMMARY

Various embodiments are provided to a semiconductor memory system capable of setting the reference voltage of a memory apparatus with accuracy in consideration of characteristics of the memory apparatus.

In an embodiment of the present invention, a semiconductor memory system may include: a memory controller configured to provide a first data having a first level and a second data having a second level; and a memory apparatus configured to adjust a level of a reference voltage by comparing the reference voltage with each of the first data and the second data, wherein the memory apparatus sets the level of the reference voltage based on an information about the reference voltage, which is increased when the first data is determined to have the second level while the memory apparatus increases the reference voltage from an initial level of the reference voltage, and an information about the reference voltage, which is decreased when the second data is determined to have the first level while the memory apparatus decreases the reference voltage from the initial level of the reference voltage.

In an embodiment of the present invention, a method of setting a voltage of a semiconductor memory system may include: at a memory controller, transmitting a first data having a first level; at a memory apparatus, receiving the first data and comparing a reference voltage with the first data while increasing the reference voltage; at the memory apparatus, storing an information about the reference voltage that is increase when the first data is determined to have a second level; at the memory controller, transmitting a second data having the second level; at a memory apparatus, receiving the second data and comparing the reference voltage with the second data while decreasing the reference voltage; at the memory apparatus, storing an information about the reference voltage that is decrease when the second data is determined to have the first level; and at the memory apparatus, setting a level of the reference voltage by computing the information about the increased reference voltage and the information about the decreased reference voltage.

In an embodiment of the present invention, a method of setting a voltage of a memory apparatus including receiving first data having a first level; comparing a reference voltage with the first data while increasing the reference voltage; storing information about the reference voltage that is increased when the first data is determined to have a second level; receiving second data having the second level; comparing the reference voltage with the second data while decreasing the reference voltage; storing information about the reference voltage that is decreased when the second data is determined to have the first level; and setting a level of the reference voltage by computing the information about the increased reference voltage and the information about the decreased reference voltage.

In an embodiment of the present invention, a system includes: a processor; a system memory controller configured to receive data from the processor; and a memory device configured to receive the data from the controller, wherein the system memory controller includes a memory controller configured to provide a first data having a first level and a second data having a second level, wherein the memory device includes a memory apparatus configured to adjust a level of a reference voltage by comparing the reference voltage with each of the first data and the second data, and wherein the memory apparatus sets the level of the reference voltage based on information about the reference voltage, which is increased when the first data is determined to have the second level while the memory apparatus increases the reference voltage from an initial level of the reference voltage, and an information about the reference voltage, which is decreased when the second data is determined to have the first level while the memory apparatus decreases the reference voltage from the initial level of the reference voltage.

BRIEF DESCRIPTION OF THE DRAWINGS

Features, aspects and embodiments are described in conjunction with the attached drawings, in which.

DETAILED DESCRIPTION

Hereinafter, a semiconductor memory apparatus and a data input and output method thereof according to the present invention will be described below with reference to the accompanying drawings through various embodiments.

Figure 1:
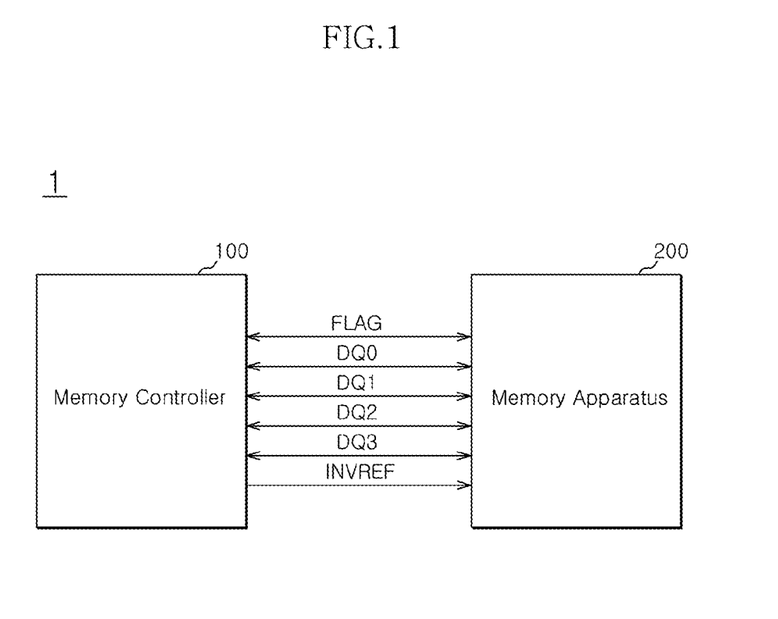
FIG. 1 is a block diagram illustrating a semiconductor memory system in accordance with an embodiment of the present invention.

Referring to FIG. 1, the semiconductor memory system 1 may include a memory controller 100 and a memory apparatus 200.

The memory controller 100 and the memory apparatus 200 may include a plurality of buses such as a command bus, an address bus, a clock bus, a data bus and so forth, through which the memory controller 100 and the memory apparatus 200 may communicate with each other.

The memory controller 100 may provide signals for controlling the memory apparatus 200. The memory controller 100 may provide command signals, address signals, clock signals and data to the memory apparatus 200 through the plurality of buses so that the memory apparatus 200 may store data. The memory controller 100 may receive data output from the memory apparatus 200.

The memory apparatus 200 may receive data sent from the memory controller 100 and store the received data in a memory cell array included in the memory apparatus 200 and may output data stored in the memory cell array to the memory controller 100.

As can be seen from FIG. 1, the memory controller 100 may transmit data DQ0 to DQ3 to the memory apparatus 200. The data DQ0 to DQ3 may be plural, in which case the data DQ0 to DQ3 may be transmitted through the plurality of buses. FIG. 1 shows 4 data buses as an example. The memory apparatus 200 may include a plurality of data pads and receiver circuits, which may be coupled to the plurality of buses, respectively, and receive the data DQ0 to DQ3 sent from the memory controller 100.

The memory apparatus 200 may transmit a flag to the memory controller 100. The memory controller 100 may also transmit a flag to the memory apparatus 200. The flag may be a signal for ordering to perform operation for setting voltage of the memory apparatus 200. For example, the memory controller 100 may transmit a flag to the memory apparatus 200 to order that the memory apparatus 200 perform operation for setting the voltage. The memory apparatus 200 may transmit a flag to the memory controller 100 to inform the memory controller 100 that part or all of operation for setting the voltage is completed, which will be described in detail.

The memory controller 100 may provide an initial reference voltage code INVREF to the memory apparatus 200.

The initial reference voltage code INVREF may be used by the memory apparatus 200 to set an initial level of a reference voltage.

The memory apparatus 200 may adjust the level of the reference voltage by comparing the voltage level of the data DQ0 to DQ3 sent from the memory controller 100 and the reference voltage that is set based on the initial reference voltage code INVREF.

The memory apparatus 200 may include a plurality of data pads and receiver circuits, as described above, and there may be a skew among the plurality of the data pads and receiver circuits in the memory apparatus 200. The semiconductor memory system 1 should compensate for the skew to guarantee smooth and accurate operation of itself, which inevitably leads the level set of the reference voltage of the memory apparatus 200. In the semiconductor memory system in accordance with the embodiment of the present invention, memory apparatus 200 may receive data DQ0 to DQ3 sent from the memory controller 100 and perform the skew-compensation operation, that is, adjustment of the level of the reference voltage by itself and thus may compensate for the skew with more accuracy.

Figure 2:
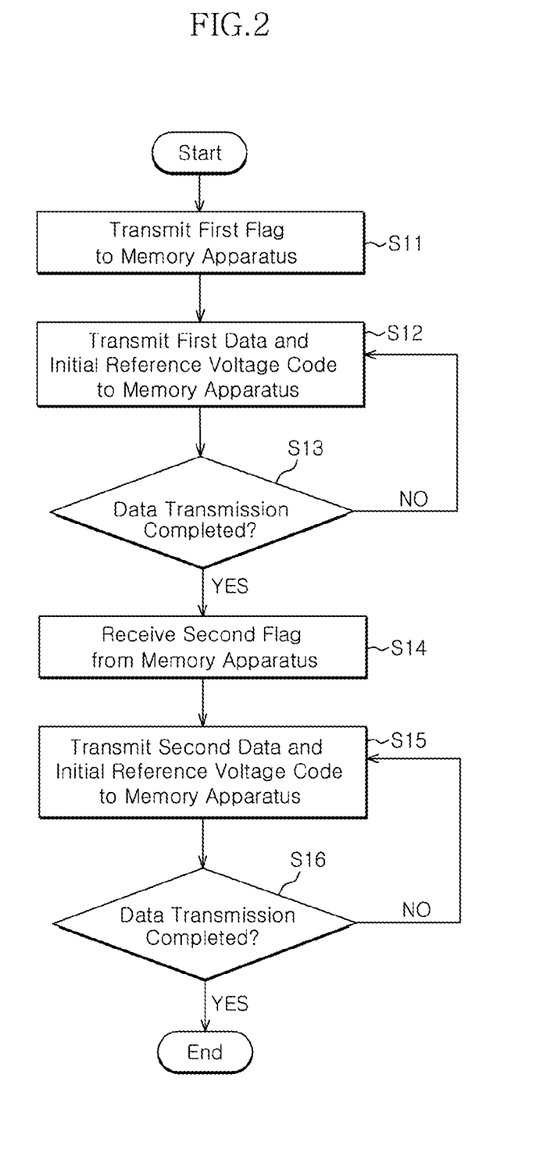
FIG. 2 is a flow chart illustrating operation of a memory controller of the semiconductor memory system in accordance with an embodiment of the present invention.

FIG. 2 is a flow chart illustrating operation of the memory controller 100 of the semiconductor memory system 1 in accordance with an embodiment of the present invention.

Referring FIGS. 1 and 2, the memory controller 100 may order the memory apparatus 200 to perform operation for setting the reference voltage by transmitting a flag to the memory apparatus 200.

The flag that the memory controller 100 transmits to the memory apparatus 200 may be a first flag (S11). Then, the memory controller 100 may transmit the initial reference voltage code INVREF and a first data, voltage level of which may be a first level, to the memory apparatus 200 (S12). In an embodiment of the present invention, the first level may be a logic high level and a second level may be a logic low level and thus the first data may have the logic high level or level of logic '1'.

Preferably, the first data may be the worst data. The worst data may have an identifiable voltage level but may not be fully driven. For example, in the case where a voltage level of data swings between 0V and 2V, the voltage level of the worst data may be higher than 1V, which may be a reference level for determination of logic level, and may not be driven to 2V. The first data suddenly output in the middle of consecutive output of data, voltage level of which may be the second level, by the memory controller 100 may be used as the worst data.

In accordance with an embodiment of the present invention, the memory controller 100 may provide to the memory apparatus 200 a reference voltage corresponding to the initial reference voltage code INVREF instead of the initial reference voltage code INVREF itself.

The memory controller 100 may transmit the first data to the memory apparatus 200 again if the transmission of the first data having the first level is not completed and wait for a flag sent from the memory apparatus 200 if the transmission of the first data having the first level is completed (S13).

The flag that the memory apparatus 200 transmits to the memory controller 100 may be a second flag (S14).

When the memory controller 100 receives the second flag sent from the memory apparatus 200, the memory controller 100 may transmit the second data having the second level and the initial reference voltage code INVREF to the memory apparatus 200 (S15). The second data may have the logic low level or level of logic '0'.

Like the first data, the second data may be the worst data. For example, in the case where a voltage level of data swings between 0V and 2V, the voltage level of the worst data may be lower than 1V, which may be a reference level for determination of logic level, and may not be driven to 0V. The second data suddenly output in the middle of consecutive output of the first by the memory controller 100 may be used as the worst data.

When the transmission of the second data is completed, the memory controller 100 may complete all of the steps for setting the voltage (S16).

At step S15, the memory controller 100 may not transmit the initial reference voltage code INVREF.

Figure 3:
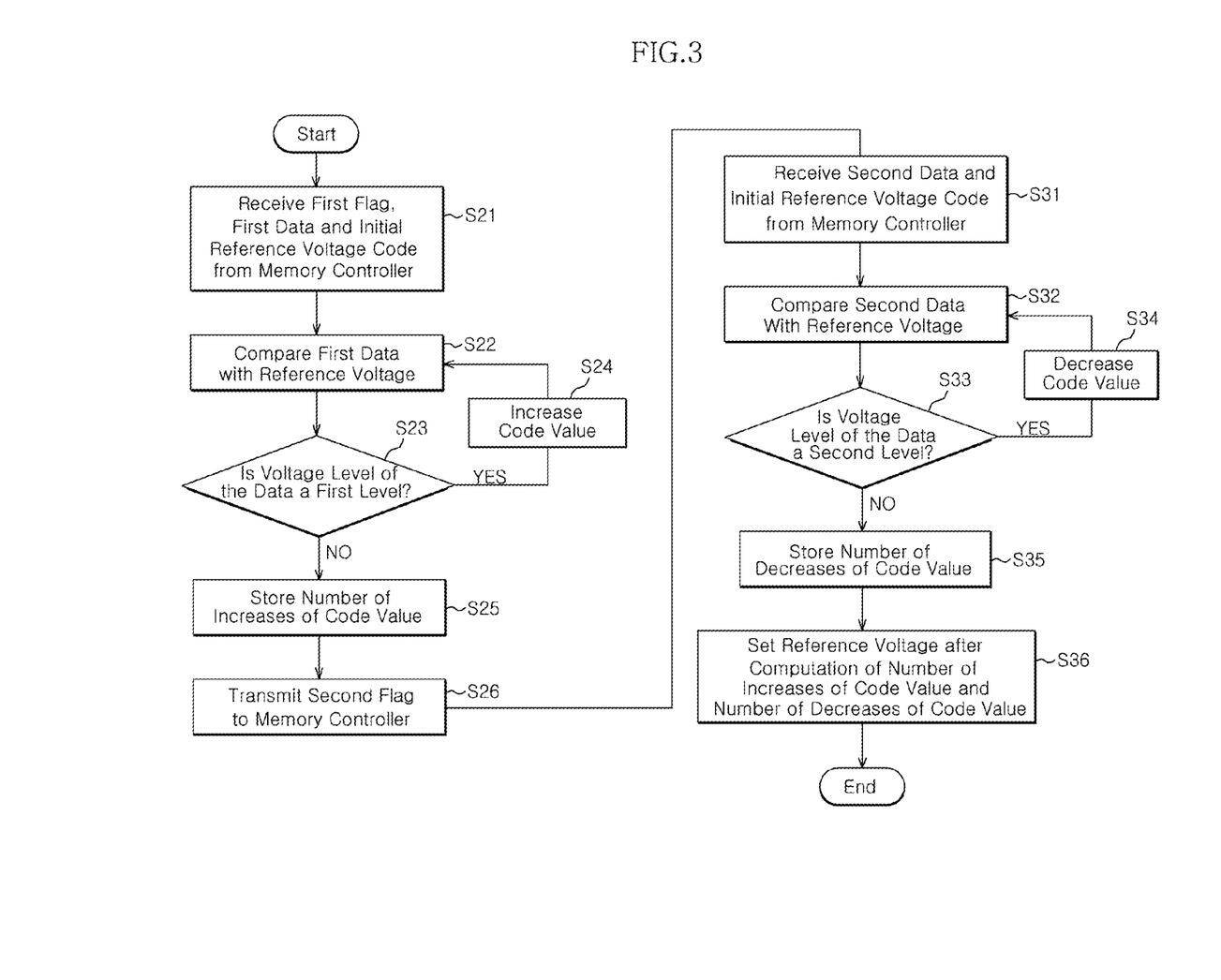
FIG. 3 is a flow chart illustrating operation of a memory apparatus of the semiconductor memory system in accordance with an embodiment of the present invention.

FIG. 3 is a flow chart illustrating operation of the memory apparatus 200 of the semiconductor memory system 1 in accordance with an embodiment of the present invention.

Referring to FIGS. 1 and 3, the memory apparatus 200 may perform operation for setting the reference voltage by receiving the first flag sent from the memory controller 100.

The memory apparatus 200 may receive the first data and the initial reference voltage code INVREF sent from the memory controller 100 (S21). The memory apparatus 200 may set an initial level of the reference voltage based on the initial reference voltage code INVREF and compare the voltage level of the first data with the reference voltage (S22). The memory apparatus 200 may increase the level of the reference voltage until the voltage level of the first data is determined as the second level. That is, the memory apparatus 200 may repeatedly compare the voltage level of the first data with the reference voltage while increasing the level of the reference voltage (S23). For example, the memory apparatus 200 may increase the value of the initial reference voltage code INVREF by 1 (one) when the voltage level of the first data is determined as the first level according to the result of comparison of step S23 (S24). The level of the reference voltage may rise from the initial level of the reference voltage whenever the value of the initial reference voltage code INVREF increases.

The memory apparatus 200 may increase the level of the reference voltage until the voltage level of the first data is determined as the second level and store information about the increased reference voltage when the voltage level of the first data is determined as the second level (S25). The information about the increased reference voltage may be an increased amount of the value of the initial reference voltage code INVREF. The memory apparatus 200 may use a number of increases of the value of the initial reference voltage code INVREF through the step S24 in order to obtain information about the increased amount of the value of the initial reference voltage code INVREF. After completion of storing the information about the number of increases of the value of the initial reference voltage code INVREF, the memory apparatus 200 may transmit the second flag to the memory controller 100 (S26).

After the second flag is transmitted to the memory controller 100, the memory apparatus 200 may receive the second data and the initial reference voltage code INVREF sent from the memory controller 100 (S31). In accordance with an embodiment of the present invention, the memory apparatus 200 may store the initial reference voltage code INVREF received at step S21 for follow-up use of the initial reference voltage code INVREF instead of receiving the initial reference voltage code INVREF at step S31. The memory apparatus 200 may compare the voltage level of the second data with the reference voltage (S32). The memory apparatus 200 may decrease the level of the reference voltage until the voltage level of the second data is determined as the first level. That is, the memory apparatus 200 may repeatedly compare the voltage level of the second data with the reference voltage while decreasing the level of the reference voltage (S33). For example, the memory apparatus 200 may decrease the value of the initial reference voltage code INVREF by 1 (one) when the voltage level of the second data is determined as the second level according to the result of comparison of step S33 (S34). The level of the reference voltage may fall from the initial level of the reference voltage whenever the value of the initial reference voltage code INVREF decreases.

The memory apparatus 200 may decrease the level of the reference voltage until the voltage level of the second data is determined as the first level and store information about the decreased reference voltage when the voltage level of the second data is determined as the first level (S35). The information about the decreased reference voltage may be a decreased amount of the value of the initial reference voltage code INVREF. The memory apparatus 200 may use a number of decreases of the value of the initial reference voltage code INVREF through the step S34 in order to obtain information about the decreased amount of the value of the initial reference voltage code INVREF.

After completion of storing the information about the number of decreases of the value of the initial reference voltage code INVREF, the memory apparatus 200 may set the level of the reference voltage based on the information about the number of increases of the value of the initial reference voltage code INVREF and the information about the number of decreases of the value of the initial reference voltage code INVREF. The memory apparatus 200 may set the level of the reference voltage by computing the number of increases of the value of the initial reference voltage code INVREF and the number of decreases of the value of the initial reference voltage code INVREF and changing the value of the initial reference voltage code INVREF (S36).

For example, when the number of increases of the value of the initial reference voltage code INVREF and the number of decreases of the value of the initial reference voltage code INVREF are identical to each other, the memory apparatus 200 may set the reference voltage to a voltage level corresponding to the value of the initial reference voltage code INVREF.

When the number of increases of the value of the initial reference voltage code INVREF is greater than the number of decreases of the value of the initial reference voltage code INVREF, the memory apparatus 200 may set the reference voltage to a voltage level corresponding to the value of the initial reference voltage code INVREF plus a half of the number of increases of the value of the initial reference voltage code INVREF from which the number of decreases of the value of the initial reference voltage code INVREF is subtracted.

When the number of decreases of the number of decreases of the value of the initial reference voltage code INVREF is greater than the number of increases of the value of the initial reference voltage code INVREF, the memory apparatus 200 may set the reference voltage to a voltage level corresponding to the value of the initial reference voltage code INVREF minus a half of the number of decreases of the value of the initial reference voltage code INVREF from which the number of increases of the value of the initial reference voltage code INVREF is subtracted.

Figure 4:
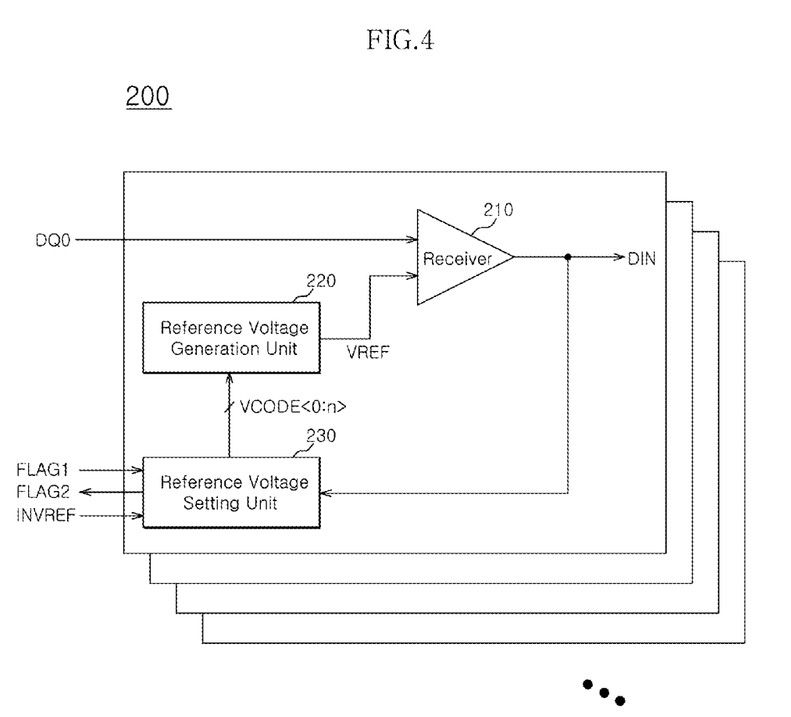
FIG. 4 is a circuit diagram illustrating the memory apparatus in accordance with an embodiment of the present invention.

FIG. 4 is a circuit diagram illustrating the memory apparatus in accordance with an embodiment of the present invention.

Referring to FIG. 4, the memory apparatus 200 may include a receiver 210, a reference voltage generation unit 220 and a reference voltage setting unit 230.

The receiver 210 may receive data DQ0 sent from the memory controller 100, compare data DQ0 and a reference voltage VREF and generate an input data DIN. The reference voltage generation unit 220 may change the reference voltage VREF in response to a reference voltage setting code VCODE<0:n>.

The reference voltage setting unit 230 may generate the reference voltage setting code VCODE<0:n>. The reference voltage setting unit 230 may allow the reference voltage generation unit 220 to set an initial level of the reference voltage VREF by receiving the initial reference voltage code INVREF sent from the memory controller 100 and providing the initial reference voltage code INVREF as the reference voltage setting code VCODE<0:n> to the reference voltage generation unit 220. The reference voltage setting unit 230 may change the reference voltage setting code VCODE<0:n> by receiving the input data DIN fed backed from the receiver 210. The reference voltage setting unit 230 may increase or decrease a value of the reference voltage setting code VCODE<0:n> according to a voltage level of the input data DIN.

The reference voltage setting unit 230 may store a number of increases and decrease of the value of the reference voltage setting code VCODE<0:n>.

The reference voltage setting unit 230 may generate the reference voltage setting code VCODE<0:n> by counting the number of increases and decrease of the value of the reference voltage setting code VCODE<0:n> and changing the value of the initial reference voltage code INVREF according to result of counting the number of increases and decrease of the value of the reference voltage setting code VCODE<0:n>.

The reference voltage setting unit 230 may receive the first flag FLAG1 and generate and output the second flag FLAG2. The reference voltage setting unit 230 may provide the initial reference voltage code INVREF as the reference voltage setting code VCODE<0:n> to the reference voltage generation unit 220 when the reference voltage setting unit 230 receives the first flag FLAG1. The reference voltage setting unit 230 may generate and output the second flag FLAG2 to the memory controller 100 when the memory apparatus 200 receives the first data and stores the number of increases of the value of the reference voltage setting code VCODE<0:n>.

FIG. 4 shows as an example the memory apparatus 200 receiving data DQ0 through a data bus. The memory apparatus 200 may include a plurality of the receivers 210, the reference voltage generation units 220 and the reference voltage setting units 230 according to a number of data buses, which may vary according to a circuit design. Further, a semiconductor memory system including a plurality of the memory apparatuses 200 may fall in the scope of the present invention.

Figure 5A:
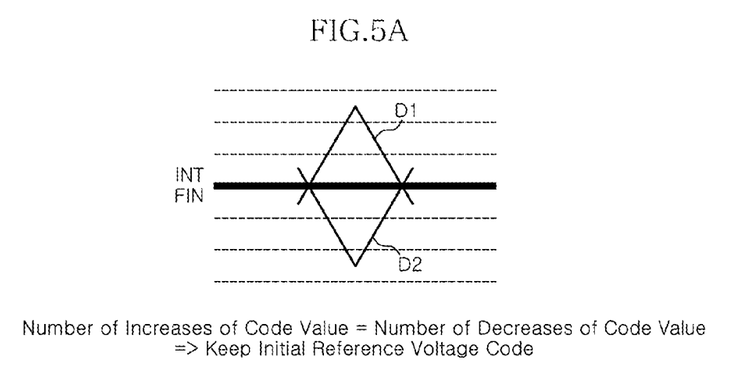
FIGS. 5A to 5C are charts illustrating a method for setting voltage of the semiconductor memory system in accordance with an embodiment of the present invention.
Figure 5B:
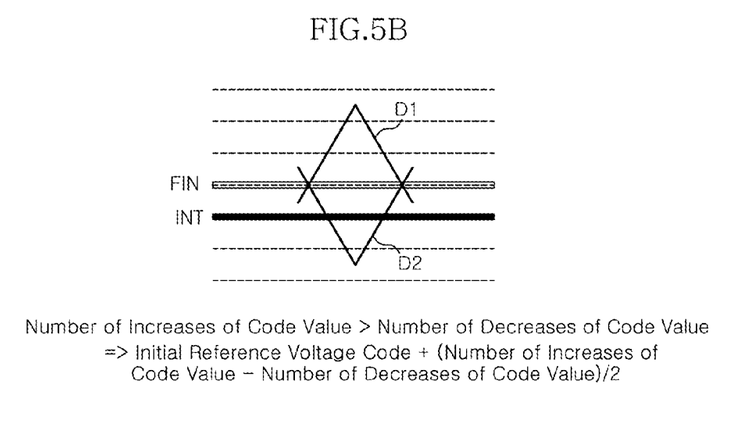
Figure 5C:
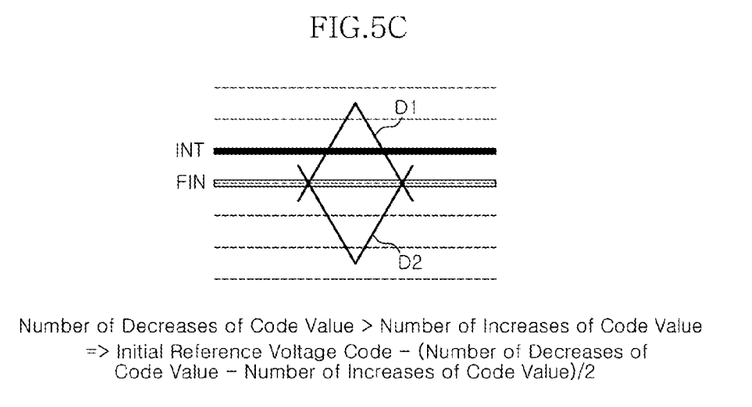

FIGS. 5A to 5C are charts illustrating a method for setting voltage of the semiconductor memory system in accordance with an embodiment of the present invention.

Referring to FIGS. 5A to 5C, broken lines may represent the levels of the reference voltage VREF. A higher line may represent a higher level of the reference voltage VREF (i.e., the top line represents the highest level of the reference voltage for that figure and the bottom line represents the lowest level of the reference voltage for that figure). Level difference between adjacent lines may represent an amount of the level of the reference voltage VREF that is changed whenever the value of the reference voltage setting code VCODE<0:n> increases or decrease by 1 (one).

Referring to FIG. 5A, an initial level INT of the reference voltage VREF may be set based on the initial reference voltage code INVREF.

The memory apparatus 200 may receive a first data D1 having the first level and repeatedly compare a voltage level of the first data D1 and the reference voltage VREF while increasing the initial level INT of the reference voltage VREF.

As can be seen from FIG. 5A, when the value of the reference voltage setting code VCODE<0:n>, which is initially set to the initial reference voltage code INVREF, increases three times, the first data D1 may be determined to have the second level and the reference voltage setting unit 230 of the memory apparatus 200 may store the number of increases of the value of the reference voltage setting code VCODE<0:n> that is currently 3.

After that, the memory apparatus 200 may receive a second data D2 having the second level and repeatedly compare a voltage level of the second data D2 and the reference voltage VREF while decreasing the initial level INT of the reference voltage VREF.

As can be seen from FIG. 5A, when the value of the reference voltage setting code VCODE<0:n>, which is initially set to the initial reference voltage code INVREF, decreases three times, the second data D2 may be determined to have the first level and the reference voltage setting unit 230 of the memory apparatus 200 may store the number of decreases of the value of the reference voltage setting code VCODE<0:n> that is currently 3.

At this time, the numbers of increases and decreases of the value of the reference voltage setting code VCODE<0:n> are identical to each other and thus the reference voltage setting unit 230 of the memory apparatus 200 may allow the reference voltage generation unit 220 to set the level of the reference voltage VREF by providing the initial reference voltage code INVREF as the reference voltage setting code VCODE<0:n> to the reference voltage generation unit 220 (Number of Increases of Code Value=Number of Decreases of Code Value=>Keep Initial Reference Voltage Code). A final level FIN of the reference voltage VREF and the initial level INT of the reference voltage VREF may be identical to each other.

FIG. 5B shows a case where a voltage level of data is higher than the initial level INT of the reference voltage VREF because of the skew.

Referring to FIG. 5B, when the value of the reference voltage setting code VCODE<0:n>, which is initially set to the initial reference voltage code INVREF, increases four times, the first data D1 may be determined to have the second level and when the value of the reference voltage setting code VCODE<0:n> decreases two times, the second data D2 may be determined to have the first level.

At this time, the number of increases of the value of the reference voltage setting code VCODE<0:n> is greater than the number of decreases of the value of the reference voltage setting code VCODE<0:n>. Thus, the reference voltage setting unit 230 of the memory apparatus 200 may set the value of the reference voltage setting code VCODE<0:n> to the value of the initial reference voltage code INVREF plus 1 (one), which is a half of 4 (four) or the number of increases of the value of the initial reference voltage code INVREF from which 2 (two) or the number of decreases of the value of the initial reference voltage code INVREF is subtracted (Number of Increases of Code Value>Number of Decreases of Code Value=>Initial Reference Voltage Code+(Number of Increases of Code Value−Number of Decreases of Code Value)/2). The final level FIN of the reference voltage VREF may be slightly higher than the initial level INT of the reference voltage VREF and thus the skew may be compensated for.

FIG. 5C shows a case where a voltage level of data is lower than the initial level INT of the reference voltage VREF because of the skew.

Referring to FIG. 5C, when the value of the reference voltage setting code VCODE<0:n>, which is initially set to the initial reference voltage code INVREF, increases two times, the first data D1 may be determined to have the second level and when the value of the reference voltage setting code VCODE<0:n> decreases four times, the second data D2 may be determined to have the first level.

At this time, the number of decreases of the value of the reference voltage setting code VCODE<0:n> is greater than the number of increases of the value of the reference voltage setting code VCODE<0:n>. Thus, the reference voltage setting unit 230 of the memory apparatus 200 may set the value of the reference voltage setting code VCODE<0:n> to the value of the initial reference voltage code INVREF minus 1 (one), which is a half of 4 (four) or the number of decreases of the value of the initial reference voltage code INVREF from which 2 (two) or the number of increases of the value of the initial reference voltage code INVREF is subtracted (Number of Decreases of Code Value>Number of Increases of Code Value=>Initial Reference Voltage Code−(Number of Decreases of Code Value−Number of Increases of Code Value)/2). The final level FIN of the reference voltage VREF may be slightly lower than the initial level INT of the reference voltage VREF and thus the skew may be compensated for.

The memory controller and memory apparatus discussed above are particular useful in the design of memory devices, processors, and computer systems. For example, referring to FIG. 6, a block diagram of a system employing a memory controller and memory apparatus in accordance with embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 6:
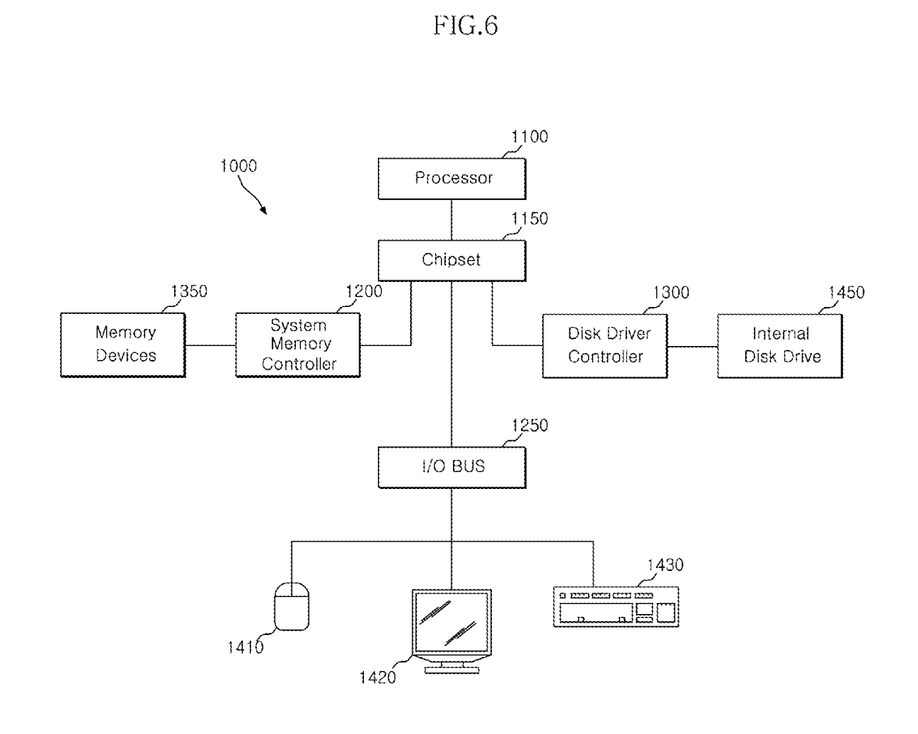
FIG. 6 illustrates a block diagram of a system employing a semiconductor memory system in accordance with the embodiments of the present invention.

A chipset 1150 may be operably coupled to the CPU 1100. The chipset 1150 is a communication pathway for signals between the CPU 1100 and other components of the system 1000, which may include a system memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the system memory controller 1200 may be operably coupled to the chipset 1150. The system memory controller 1200 may include at least one memory controller 100 as discussed above with reference to FIGS. 1-5 above. Thus, the system memory controller 1200 can receive a request provided from the CPU 1100, through the chipset 1150. In alternative embodiments, the system memory controller 1200 may be integrated into the chipset 1150. The system memory controller 1200 may be operably coupled to one or more memory devices 1350. In an embodiment, the memory devices 1350 may corresponded to or include the memory apparatus 200 discussed above with reference to FIGS. 1-5, the memory apparatus 200 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing a semiconductor memory system having the functions discussed above with reference to FIGS. 1-5. In alternative embodiments, such as cellular phones or digital cameras, the components may differ from the embodiment shown in FIG. 6.

While various embodiments have been described above, it will be understood to those skilled in the art that the embodiments described are by way of example only. Accordingly, the semiconductor memory system described herein should not be limited based on the described embodiments. Rather, the semiconductor memory system described herein should only be limited in light of the claims that follow when taken in conjunction with the above description and accompanying drawings.

What is claimed is:

1. A semiconductor memory system comprising:
 a memory controller configured to provide a first data having a first level and a second data having a second level; and
 a memory apparatus configured to adjust a level of a reference voltage by comparing the reference voltage with each of the first data and the second data,
 wherein the memory apparatus sets the level of the reference voltage based on information about the reference voltage, which is increased when the first data is determined to have the second level while the memory apparatus increases the reference voltage from an initial level of the reference voltage, and information about the reference voltage, which is decreased when the second data is determined to have the first level while the memory apparatus decreases the reference voltage from the initial level of the reference voltage,
 wherein the memory apparatus changes the level of the reference voltage in response to a reference voltage setting code, and increases or decreases a value of the reference voltage setting code based on an initial reference voltage code and a input data generated by comparing the reference voltage with each of the first data and the second data.

2. The semiconductor memory system of claim 1, wherein the memory controller provides the initial reference voltage code to the memory apparatus in order to set the initial level of the reference voltage.

3. The semiconductor memory system of claim 2, wherein the memory apparatus receives the initial reference voltage code and increase or decrease the level of the reference voltage by increasing or decreasing the initial reference voltage code.

4. The semiconductor memory system of claim 1, wherein the first data and the second data are worst data.

5. The semiconductor memory system of claim 2, wherein the memory apparatus comprises:
 a receiver configured to generate the input data by comparing the reference voltage with each of the first data and the second data;
 a reference voltage generation unit configured to change the level of the reference voltage in response to the reference voltage setting code; and
 a reference voltage setting unit configured to increase or decrease a value of the reference voltage setting code based on the initial reference voltage code and the input data.

6. The semiconductor memory system of claim 5, wherein the reference voltage setting unit changes the reference voltage setting code by computing a number of increases of the value of the reference voltage setting code and a number of decreases of the value of the reference voltage setting code and adding the computing result to the initial reference voltage code or subtracting the computing result from the initial reference voltage code.

7. The semiconductor memory system of claim 6, wherein the reference voltage setting unit generates the reference voltage setting code corresponding to the initial reference voltage code when the number of increases and the number of decreases are identical to each other.

8. The semiconductor memory system of claim 6, the reference voltage setting unit generates the reference voltage setting code by adding a half of the number of increases, from which the number of decreases is subtracted, to the initial reference voltage code when the number of increases is greater than the number of decreases.

9. The semiconductor memory system of claim 6, the reference voltage setting unit generates the reference voltage setting code by subtracting a half of the number of decreases, from which the number of increases is subtracted, from the initial reference voltage code when the number of decreases is greater than the number of increases.

10. A method of setting a voltage of a semiconductor memory system comprising:
 at a memory controller, transmitting a first data having a first level;
 at a memory apparatus, receiving the first data and comparing a reference voltage with the first data while increasing the reference voltage;
 storing information about the reference voltage that is increased when the first data is determined to have a second level;
 at the memory controller, transmitting a second data having the second level and the initial reference voltage code;
 at a memory apparatus, receiving the second data and comparing the reference voltage with the second data while decreasing the reference voltage;
 storing information about the reference voltage that is decreased when the second data is determined to have the first level; and
 at the memory apparatus, setting a level of the reference voltage by computing the information about the increased reference voltage and the information about the decreased reference voltage,
 wherein the memory controller transmits an initial reference voltage code on or before transmitting the first data and the second data, and the memory apparatus sets an initial level of the reference voltage according to the initial reference voltage code,
 wherein the increasing the reference voltage is performed by increasing the initial reference voltage code at the memory apparatus, and the information about the increased reference voltage is an information about an increased amount of a value of the initial reference voltage code.

11. The method of claim 10, wherein the first data and the second data are worst data.

12. The method of claim 10, wherein the decreasing the reference voltage is performed by decreasing the initial reference voltage code at the memory apparatus, and
 wherein the information about the decreased reference voltage is an information about a decreased amount of the value of the initial reference voltage code.

13. The method of claim 12, wherein the setting of the level of the reference voltage comprises setting the reference voltage to a voltage level corresponding to the initial reference voltage code when the increased amount and the decreased amount are identical to each other.

14. The method of claim 12, wherein the setting of the level of the reference voltage comprises setting the reference voltage by adding a half of the increased amount, from which the decreased amount is subtracted, to the initial reference voltage code when the increased amount is greater than the decreased amount.

15. The method of claim 12, wherein the setting of the level of the reference voltage comprises setting the reference voltage by subtracting a half of the decreased amount, from which the increased amount is subtracted, from the initial reference voltage code when the increased amount is lesser than the decreased amount.

16. The method of claim 10, further comprising, at the memory apparatus, transmitting a flag to the memory controller after storing the information about the increased reference voltage,
 wherein the memory controller transmits the second data to the memory apparatus in response to the flag.

17. A system comprising:
 a processor;
 a system memory controller configured to receive data from the processor; and
 a memory device configured to receive the data from the controller,
 wherein the system memory controller includes a memory controller configured to provide a first data having a first level and a second data having a second level,
 wherein the memory device includes a memory apparatus configured to adjust a level of a reference voltage by comparing the reference voltage with each of the first data and the second data, and
 wherein the memory apparatus sets the level of the reference voltage based on information about the reference voltage, which is increased when the first data is determined to have the second level while the memory apparatus increases the reference voltage from an initial level of the reference voltage, and an information about the reference voltage, which is decreased when the second data is determined to have the first level while the memory apparatus deceases the reference voltage from the initial level of the reference voltage, wherein the memory apparatus changes the level of the reference voltage in response to a reference voltage setting code, and increases or decreases a value of the reference voltage setting code based on an initial reference voltage code and a input data generated by comparing the reference voltage with each of the first data and the second data.

* * * * *